United States Patent

Chan et al.

Patent Number: 6,046,616
Date of Patent: Apr. 4, 2000

[54] TWO DIMENSIONAL RANDOM PULSE GENERATOR

[75] Inventors: Chee Oei Chan; Hwa Seng Yap, both of Singapore, Singapore

[73] Assignee: Tritech Microelectronics, Ltd., Singapore, Singapore

[21] Appl. No.: 09/131,120

[22] Filed: Aug. 7, 1998

[51] Int. Cl.[7] .................................................. H03K 3/84
[52] U.S. Cl. ........................................... 327/164; 327/175
[58] Field of Search ........................... 327/164, 172–176, 327/291–294

[56] References Cited

U.S. PATENT DOCUMENTS

| | | | |
|---|---|---|---|
| 4,578,598 | 3/1986 | Faulhaber | 307/271 |
| 5,416,434 | 5/1995 | Kootstra et al. | 327/113 |
| 5,530,390 | 6/1996 | Russell | 327/164 |
| 5,563,573 | 10/1996 | Ng et al. | 338/334 |
| 5,680,516 | 10/1997 | Kadowaki et al. | 395/27 |
| 5,944,833 | 8/1999 | Ugon | 713/400 |

*Primary Examiner*—Kenneth B. Wells
*Assistant Examiner*—Anh-Quan Tra
*Attorney, Agent, or Firm*—George O. Saile; Stephen B. Ackerman; Billy Knowles

[57] ABSTRACT

A pseudo random pulse generator that creates a series of pulses having randomly separated intervals is described. A pseudo random pulse generator has a pseudo random number generator create a series of pseudo random binary numbers. An enable input initiates creating the series of pseudo random binary numbers and a clock input is connected to a clock signal that synchronizes creating the series of pseudo random binary numbers. A hold input prevents the generation of the pseudo random binary numbers. The pseudo random pulse generator has an interval selector to select one of a plurality of timing signals. Each timing signal is a power of two frequency division of the clock. The interval selector has select signal terminals to select one of the plurality of timing signals, and a trigger output to hold a selected timing signal. The pseudo random pulse generator further has a select buffer connected to a low order digits of the pseudo random number generator. The select buffer will transfer the low order digits to the select signal terminals of the interval selector. The low order digits of the pseudo random number selects one of the plurality of timing signals. A first pulse generator provides a single pulse for one clock cycle to generate a next pseudo random number. A second pulse generator creates the pulse output of the pseudo random pulse generator.

27 Claims, 7 Drawing Sheets

FIG. 2 – Prior Art

TWO DIMENSIONAL RANDOM PULSE GENERATOR

BACKGROUND OF THE INVENTION

1. Field of the Invention

This invention relates to electronic pulse generation circuit and more particularly to pulse generation circuits that have a random interval between pulses.

2. Description of Related Art

It is not possible to produce truly random sequences of numbers in deterministic system such as logic circuits or computer systems. However, the generation of pseudo random sequences of numbers, either decimal or binary is well known in the art. A common method for the generation of random numbers is the additive congruential method. The additive congruential method employs the following formula to generate the random number:

$$a[k]=(a[k-b]+a[k-c]) \bmod m$$

where:
- a[k] is the $k^{th}$ digit of a sequence of digits
- a[k-b] is the $b^{th}$ previous digits of the sequence of digits.
- a[k-c] is the $c^{th}$ previous digits of the sequence of digits.
- MOD m is the modulus of the number system for the sequence of numbers. In the case of a binary system, MOD m is equal to 2.

This formula can be implemented as a linear feedback shift register as shown in FIG. 2. The linear feedback shift register consists of the flip-flops U1, U2, U3, U4 and U5. The output of the flip-flops U1, U2 U3, and U4 are connected respectively to the inputs of the flip-flops U2, U3, U4, and U5. The output of the flip-flop U5 is connected to the first input of the exclusive-OR U6. The second input of the exclusive-OR U6 is connected to the output of the flip-flop U2. The output of the exclusive-OR U6 is connected to the input of the flip-flop U1. The clock CLK provides the signal necessary to sequentially transfer the signal at the input of the flip-flop U1 through flip-flops U2, U3, and U4 to the flip-flop U5. The outputs Q0, Q1, Q2, Q3, and Q4 of the flip-flops U1, U2, U3, U4 and U5 form a pseudo random binary number. The low order bit is formed by the output Q0 of the flip-flop U1 and the high order bit is formed by the output Q4 of the flip-flop U5. The circuit as shown produces the following sequence at each cycle of the clock CLK:

|     | Q4 | Q3 | Q2 | Q1 | Q0 |
| --- | --- | --- | --- | --- | --- |
| T0  | 1 | 1 | 1 | 1 | 1 |
| T1  | 1 | 1 | 1 | 1 | 0 |
| T2  | 1 | 1 | 1 | 0 | 0 |
| T3  | 1 | 1 | 0 | 0 | 1 |
| T4  | 1 | 0 | 0 | 1 | 1 |
| T5  | 0 | 0 | 1 | 1 | 0 |
| T6  | 0 | 1 | 1 | 0 | 1 |
| T7  | 1 | 1 | 0 | 1 | 0 |
| T8  | 1 | 0 | 1 | 0 | 0 |
| T9  | 0 | 1 | 0 | 0 | 1 |
| T10 | 1 | 0 | 0 | 1 | 0 |
| T11 | 0 | 0 | 1 | 0 | 0 |
| T12 | 0 | 1 | 0 | 0 | 0 |
| T13 | 1 | 0 | 0 | 0 | 0 |
| T14 | 0 | 0 | 0 | 0 | 1 |
| T15 | 0 | 0 | 0 | 1 | 0 |
| T16 | 0 | 0 | 1 | 0 | 1 |
| T17 | 0 | 1 | 0 | 1 | 0 |

-continued

|     | Q4 | Q3 | Q2 | Q1 | Q0 |
| --- | --- | --- | --- | --- | --- |
| T18 | 1 | 0 | 1 | 0 | 1 |
| T19 | 0 | 1 | 0 | 1 | 1 |
| T20 | 1 | 0 | 1 | 1 | 1 |
| T21 | 0 | 1 | 1 | 1 | 0 |
| T22 | 1 | 1 | 1 | 0 | 1 |
| T23 | 1 | 1 | 0 | 1 | 1 |
| T24 | 1 | 0 | 1 | 1 | 0 |
| T25 | 0 | 1 | 1 | 0 | 0 |
| T26 | 1 | 1 | 0 | 0 | 0 |
| T27 | 1 | 0 | 0 | 0 | 1 |
| T28 | 0 | 0 | 0 | 1 | 1 |
| T29 | 0 | 0 | 1 | 1 | 1 |
| T30 | 0 | 1 | 1 | 1 | 1 |

The sequence repeats continuously. It should be noted that the sequence can have no zero value or it ceases to operate. Additionally, the circuit as configured produces the binary numbers available only once within a cycle of the sequence of numbers and is therefore, not really pseudo random. This method though is generally adequate for many practical applications.

U.S. Pat. No. 5,680,516 (Kadowaki et al.) describes a multiple pulse series generating device that incorporates a linear feedback shift register and a data providing logic circuit to adjust the probability density of the multiple pulse series.

U.S. Pat. No. 5,563,573 (Ng et al.) discloses a pseudo random switched resistor that emulates a relatively high impedance. The control of the switched resistor is a pseudo random pulse generator. The pseudo random pulse is a linear feedback shift register similar to that described in FIG. 2.

U.S. Pat. No. 4,578,598 (Faulhuber) teaches a random pulse generator circuit that incorporates a linear feedback shift register similar to that described in FIG. 2. A digital-to-analog converter, a voltage-to-frequency converter, and circuitry provides the random sequence of output pulses. The pulse duration, the pulse interval, the pulse repetition frequency, and the degree of randomness of the pulse repetition frequency are selectable.

U.S. patent application Ser. No. 09/048,381 (Yap et al.) filed, Mar. 26, 1998 for "A Pseudo-Random Telemetric Data Communication System" and assigned to the same assignee as this invention, requires that telemetric data be transmitted in pseudo random intervals from a transmitter to a telemetric data receiver. The pseudo random intervals are sufficiently separated that multiple transmitters may send telemetric data, while minimizing the probability of collisions between data transmissions. FIG. 1 shows a representative plot of an output of the pseudo random sequence generator that determines the timing sequence of the transmission of the telemetric data.

The pseudo random sequence generator has an inactive period of time Tia where the pseudo random sequence generator produces no pulses. At the end of the inactive period of time Tia, the active period of time begins. A number of pulses $P_1, P_2, \ldots, P_n$ is generated. The interval between each pulse Tp is pseudo randomly determined.

The randomness of the transmissions of the telemetric data has to be sufficient that the telemetric data is transferred with minimal collisions from other telemetric sources.

SUMMARY OF THE INVENTION

An object of this invention is to provide a device that creates a series of pulses having randomly separated intervals during an active time period.

Another object of this invention is to provide a device that creates a series of randomly separated pulses during a randomly determined active time.

To accomplish this and other objects, a pseudo random pulse generator has a pseudo random number generator. The pseudo random number generator creates a series of pseudo random binary numbers. An enable input initiates creating the series of pseudo random binary numbers and a clock input is connected to a clock signal that synchronizes creating the series of pseudo random binary numbers. A plurality of output terminals hold each pseudo random binary number for transfer. A hold input prevents the generation of one pseudo random binary number during a clock cycle.

The pseudo random pulse generator has an interval selector. The interval selector has a plurality of timing signal input terminals to receive a plurality of timing signals. Each timing signal is a power of two frequency division of the clock. The interval selector has a plurality of select signal terminals to select one of the plurality of timing signals, and a trigger output to hold a selected timing signal;

The pseudo random pulse generator further has a select buffer. The select buffer has a plurality of input terminals connected to a low order subset of the plurality of output terminals of the pseudo random number generator. The select buffer has a plurality of output terminals connected to the select signal terminals of the interval selector, and a strobe input to transfer a low order pseudo random number from the plurality of input terminals to the plurality of output terminals. The low order pseudo random numbers present at the low order subset of the plurality of output terminals selects one of the plurality of timing signals.

The pseudo random pulse generator has a first pulse generator. The first pulse generator has a trigger input connected to the trigger output of the interval selector. The first pulse generator has a clock input connected to the clock signal and a hold output. The hold output transits from a first logic level to a second logic level and return to the first logic level after one clock cycle when the selected timing signal transits between the first logic level and the second logic level.

The pseudo random pulse generator has a second pulse generator. The second pulse generator has a trigger input connected to a higher order output terminal of the plurality of output terminals of pseudo random number generator. The second pulse generator has a clock input connected to the clock signal and a pulse output to transfer the series of pulses to external circuitry. The pulse output transits from the first logic level to the second logic level and return to the first logic level after one clock cycle when the higher order output terminal transits between the first logic level and the second logic level.

The pseudo random pulse generator further may have a frequency synthesizer. The frequency synthesizer has a frequency generating source to create a fundamental frequency generator signal. A frequency dividing circuit is connected to the frequency generating source to create the plurality of timing signals by dividing the fundamental frequency signal by successive powers of two.

The frequency synthesizer has a clock output terminal to transfer the fundamental frequency as the clock, and a plurality of timing signal output terminals. The timing signal output terminals are connected to the timing signal input terminals of the interval selector to transfer the plurality of timing signals to the interval selector.

The frequency dividing circuit may further create a higher order timing signal. The higher order timing signal has a frequency that is one half a highest order timing signal of the plurality timing signals. The higher order timing signal is transferred to a higher order output terminal. The higher order output terminal is connected to the enable input of the pseudo random number generator to transfer the higher order timing signal to initiate creating of the series of pseudo random binary numbers when the higher order timing signal transits between the first logic level and the second logic level.

The pseudo random number generator is an additive congruential pseudo random number generator, and may be implemented as a linear feedback shift register having a plurality of flip-flops connected serially to form a shift register. The last flip-flop output of the plurality of flip-flops is logically combined with any other flip-flop output to form an input of a first flip-flop of the plurality of flip-flops. The plurality of flip-flops must number at least a number of digits of the pseudo random binary number in addition to a digit representing the higher order output terminal of the pseudo random number generator.

DETAILED DESCRIPTION OF THE INVENTION

Returning to FIG. 1, while Yap et al. requires the inactive period of time Tia, and the number of pulses $P_1, P_2, \ldots, P_n$ within the active period of time Ta to be fixed, the inactive period of time Tia, the number of pulses, the active period of time Ta, the period Tp between each pulse $P_1, P_2, \ldots, P_n$, and the width of each pulse $P_1, P_2, \ldots, P_n$ may be random or approximately random. A pseudo random interval generator that can create the above-described timings is described in FIG. 3.

Conceptually, the active period could be completely random. However, for practical implementation, the active period Ta should be greater than the width of one of the pulses $P_1, P_2, \ldots, P_n$. Further, the active period of time Ta should be greater than the total time for all the randomly selected pulses and the time for the randomly selected period Tp between each pulse $P_1, P_2, \ldots, P_n$.

Figure 2:
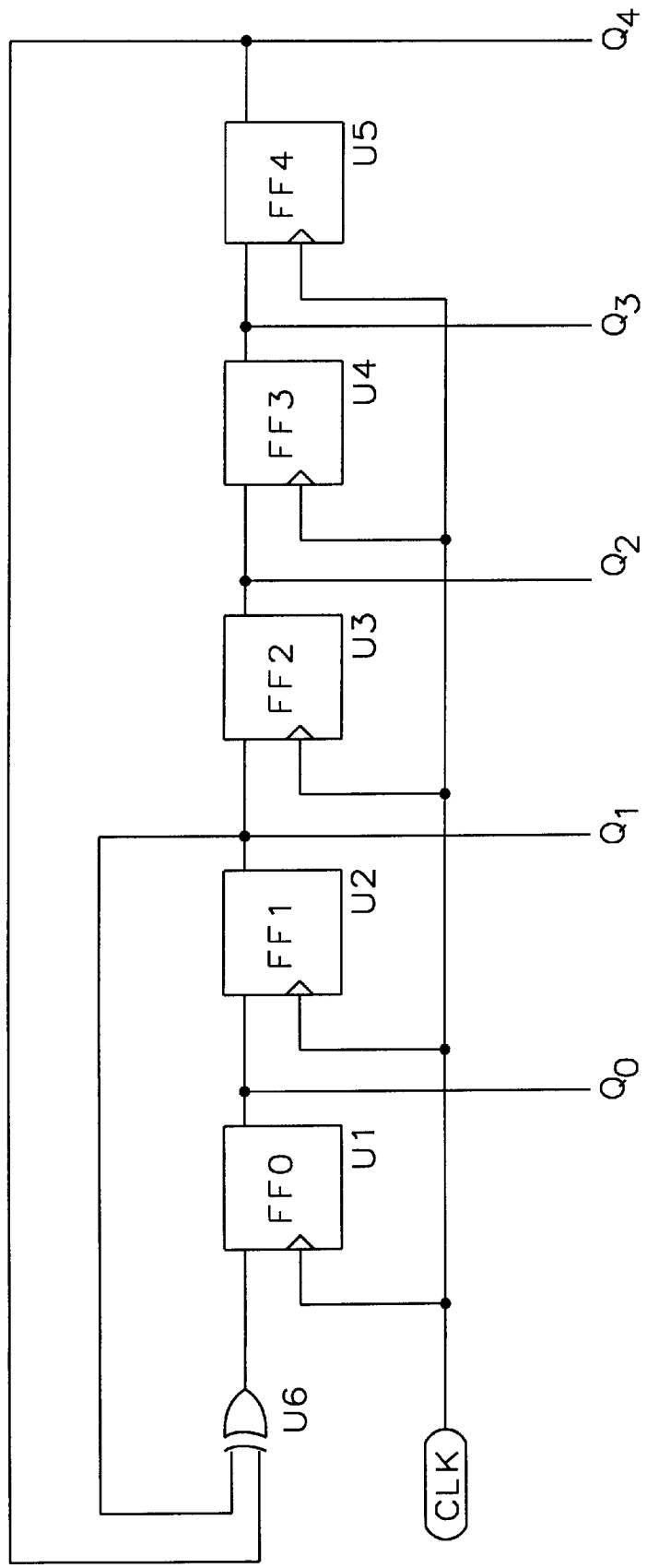
FIG. 2 is a schematic diagram of a linear feedback shift register connected as a pseudo random binary number generator of the prior art.

The pseudo random interval generator has a pseudo random counter U7. The pseudo random counter U7 generates a random number that determines the interval between pulses at the output of the pseudo random interval generator. The pseudo random counter U7 can be implemented as an additive congruential pseudo random number generator. The implementation can be a linear feedback shift register as described in FIG. 2.

The lower order outputs Q0, Q1, Q2, ..., QM of the pseudo random counter U7 are the inputs to the M bit buffer U11. The most significant bit QN of the pseudo random counter U7 is the trigger input TGR of the pulse generator U10.

The enable input of the pseudo random counter U7 has a signal that allows or prevents the generation of the pseudo random number. The clock signal CLK synchronizes the generation of each pseudo random number within the pseudo random counter. The hold signal $\overline{HOLD}$ momentarily stops the generation of the pseudo random numbers at each clock cycle within the pseudo random counter U7.

When the hold signal $\overline{HOLD}$ is active and the most significant bit QN of the pseudo random counter U7 transits from a first logic level (0) to a second logic level (1) the pulse generator, the pulse generator U10 transmits a single pulse from the output terminal Z the width of the width of the clock CLK cycle. The output terminal Z is the output of the pseudo random interval generator U7 and the time between the pulses is the pulse interval Tp of FIG. 1. The output terminal Z of the pulse generator U10 is connected to the strobe terminal M bit buffer. The low order digits of the pseudo random number present at the lower order outputs Q0, Q1, Q2, ... QM of the pseudo random counter U7 is transferred to the output terminals S0, S1, S2, ..., SM of the M bit buffer. The output terminals S0, S1, S2, ..., SM of the M bit buffer U11 form the select input terminals S0, S1, S2, ..., SM of the $2^M$ to 1 Multiplexer U8.

The $2^M$ to 1 Multiplexer U8 has $2^M$ input terminals F0, F1, F2, ... F2$^M$ (M is the number of select terminals S0, S1, S2, ..., SM) of the $2^M$ to 1 Multiplexer U8 that provide a series of digital waveforms. The series of digital waveforms each have a cycle time that is a successive power of two of the clock CLK cycle time that is the digital waveform at the terminal F0 has a cycle time that is twice that of the clock CLK. The digital waveform at the terminal F1 has a cycle time that is four times that of the clock CLK. The digital waveform at the terminal F2$^M$ has a cycle time that is $2^M$ times that of the clock CLK.

The binary number present at the select terminal selects one of the digital waveforms F0, F1, F2, ..., F2$^M$ to be transferred to the output terminal of the $2^M$ to 1 Multiplexer U8 and form the trigger signal. The output terminal of the $2^M$ to 1 Multiplexer U8 is connected to the trigger input TGR of the pulse generator U9.

The clock CLK is a second input to the pulse generator U9. The output of the pulse generator U9 has a pulse that transitions from the first logic (0) level to the second logic level (1) and returns to the first logic level after one cycle of the clock CLK upon the transition of the trigger signal from the first logic level (0) to the second logic level (1). The output Z of the pulse generator U9 is the hold signal $\overline{HOLD}$. The time that the hold signal $\overline{HOLD}$ is at the second logic level (1) allows the pseudo random counter U7 to create a new pseudo random number.

If the new pseudo random number has its most significant bit QN transit from the first logic level (0) to the second logic level (1), the pulse generator U10 creates an output and a new interval is chosen. If the new pseudo random number does not have its most significant bit transit from the first logic level (0) to the second logic level (1), the M bit buffer U11 does not change the select signals S0, S1, S2, ..., SM and digital waveform F0, F1, F2, ... F2$^M$ selected does not change.

The pseudo random interval generator may further include a frequency divider U12 to create the clock CLK and the digital waveforms F0, F1, F2, ... F2$^N$. An external frequency source CLKIN is the input to the frequency divider U12. The signal of the external frequency source CLKIN is buffered, and appropriately divided to form the clock CLK and the digital waveforms F0, F1, F2, ... F2$^M$.

Figure 1:
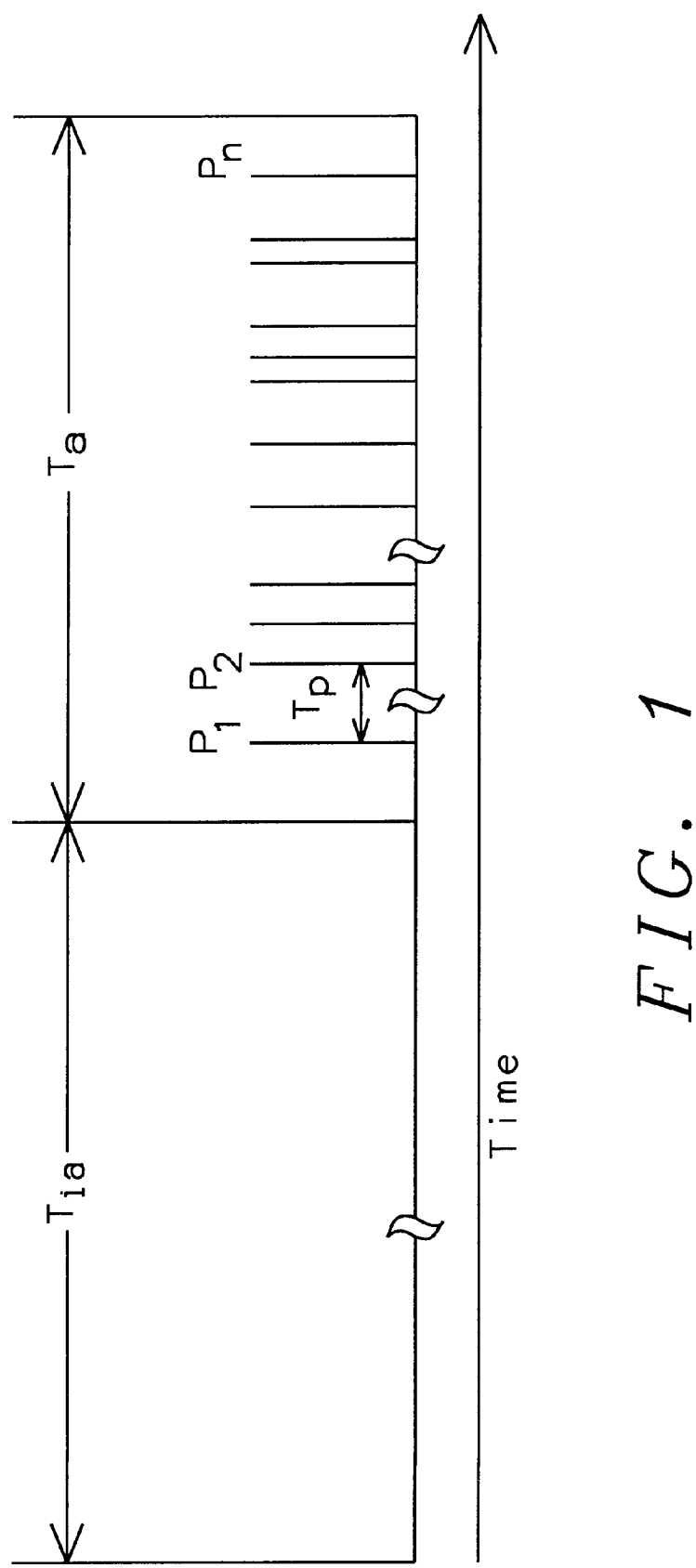
FIG. 1 is a timing diagram of the signal required of pseudo random pulse generator of this invention.
Figure 4:
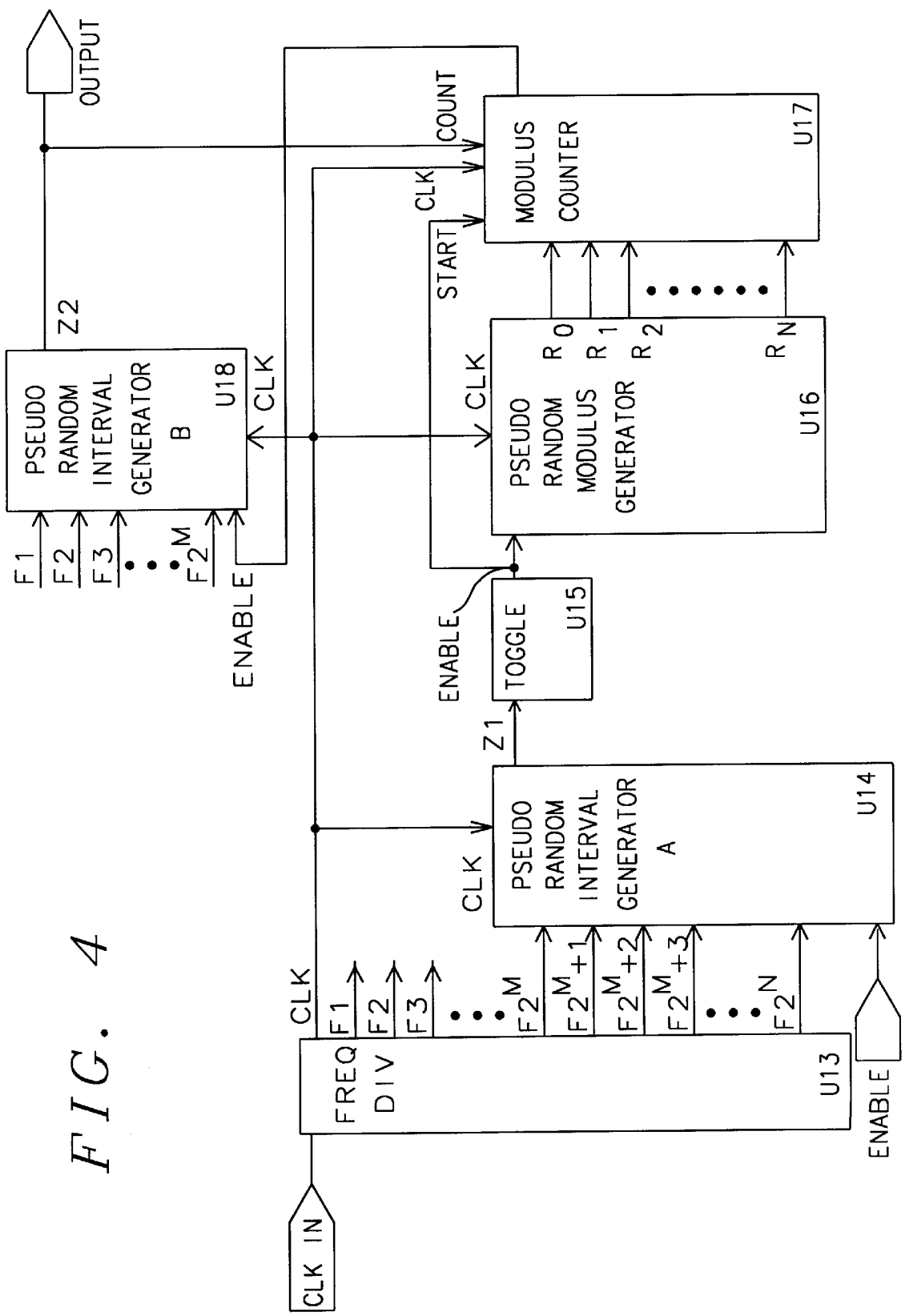
FIG. 4 is a block diagram of a pseudo random pulse generator of this invention.

Refer now to FIG. 4 for a pseudo random pulse generator having a random inactive time Tia of FIG. 1, a random active time Ta of FIG. 1, a random number of pulses P1, P2, ..., Pn of FIG. 1, and a random pulse interval Tp of FIG. 1. A pseudo random interval generator U14 determines the inactive time Tia of FIG. 1. The pseudo random interval generator U14 has a set of inputs that are the digital waveforms F2$^M$+1, F2$^M$+2, F2$^M$+3, ..., F2$^N$. The digital waveforms F2$^M$+1, F2$^M$+2, F2$^M$+3, ..., F2$^N$ each have a cycle time that is twice that of each preceding digital waveform.

An enable input activates and deactivates the generation of the inactive time Tia and the active time Ta of FIG. 1. The clock input CLK synchronizes the generation pulses that is present at the output Z1 that are the intervals for the inactive time Tia and the active time Ta of FIG. 1.

Figure 3:
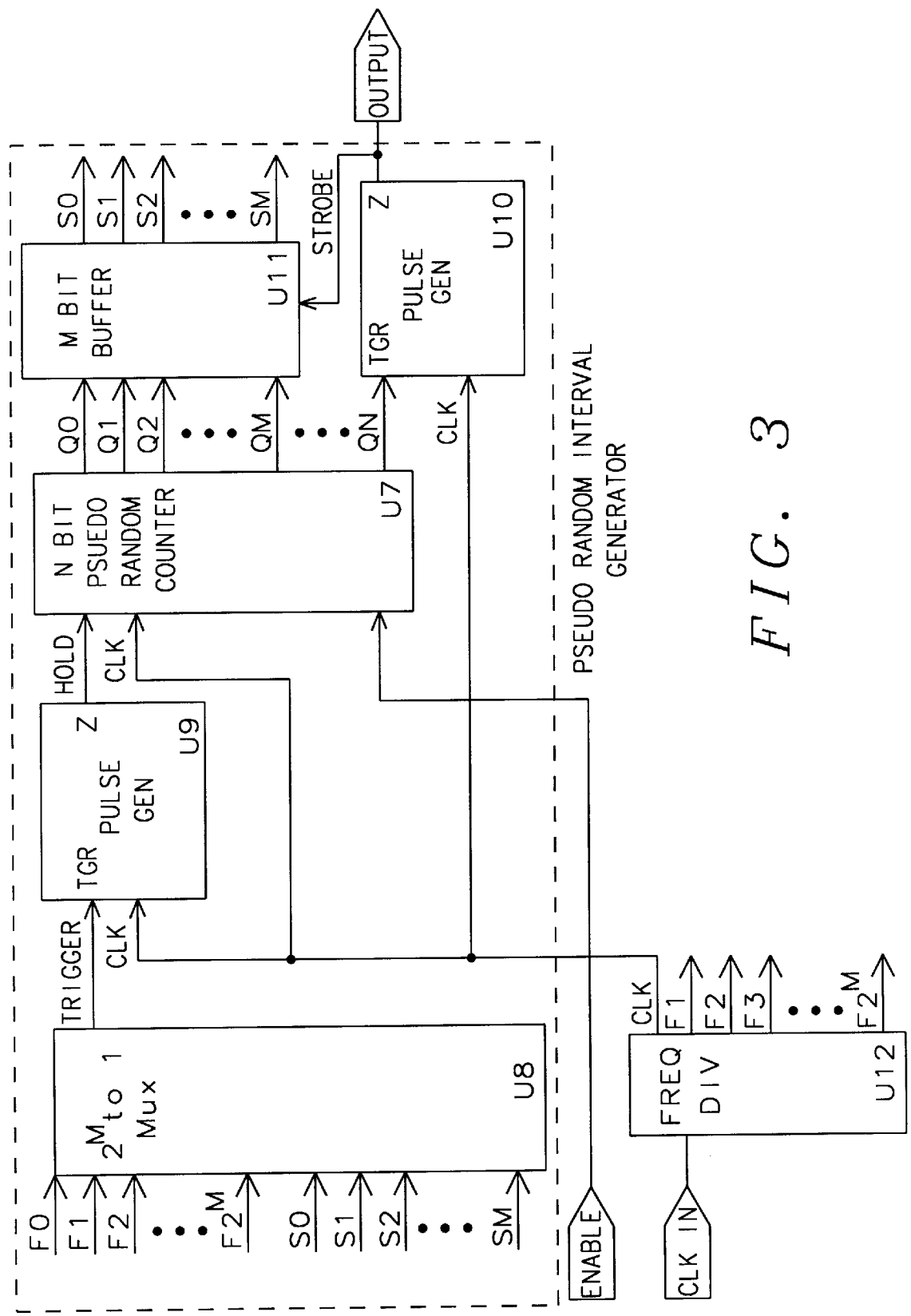
FIG. 3 is a block diagram of a pseudo random interval generator of this invention.

The pseudo random interval generator U14 functions as described in FIG. 3. The output Z1 of the pseudo random interval generator A U14 is the input of the toggle circuit U15. The output of the toggle circuit U15 changes from the first logic state (0) to the second logic level (1) to indicate the initiation of active time Ta of FIG. 1. upon the generation of a pulse from the pseudo random interval generator A U14.

A succeeding pulse from the pseudo random interval generator A U14 causes the output of the toggle circuit U15 to transit from the second logic level (1) to the first logic level (0) to terminate the active time Ta of FIG. 1 and initiate the inactive time Tia of FIG. 1. The next succeeding pulse from the output Z1 of the pseudo random interval generator U14 causes the toggle circuit U15 to transit from the first logic level (0) to the second logic level (1) to terminate the inactive time Tia of FIG. 1 and begin the next active time. Each succeeding pulse from the output Z1 of the pseudo random interval generator A U14 causes the toggle circuit to change between the first logic level (0) and the second logic level (1) to indicate the active time Ta of FIG. 1 and the inactive time Tia of FIG. 1.

When the output of the toggle circuit change from the first logic level (0) to the second logic level (1), the pseudo random modulus counter U16 generates a random number indicating the number of pulses P1, P2, ..., Pn to be transmitted during the active time Ta of FIG. 1. The random number generator can employ additive congruential method of pseudo random number generation as implemented as a linear feedback shift register as described for the pseudo random counter U7 of FIG. 3.

The clock CLK is an input to the pseudo random modulus generator U16 that synchronizes the generation and transfer of the pseudo random number to the output R0, R1, R2, ..., RN of the pseudo random modulus generator U16.

The outputs R0, R1, R2, ..., RN of the pseudo random modulus generator U16 are connected to the inputs of the modulus counter U17. The output of the toggle circuit U15 is connected to the start input of the modulus counter. The clock CLK signal synchronizes the operation of the modulus counter U17.

At the transition of the toggle circuit from the first logic level (0) to the second logic level (1), and the arrival of the critical edge of the clock (CLK), the output of the modulus counter U17 transits from the first logic level (0) to the second logic level (1) indicating the beginning of the active time Ta of FIG. 1. The modulus counter counts the pulses that arrive at the count input. The count input is connected to the output terminal of the pseudo random pulse generator. The critical edge of the clock (CLK) is the transition between the first logic level (0) and the second logic level (1) at which time the above-described synchronization occurs.

The modulus counter U17 counts the number of pulses present at the output of the pseudo random pulse generator. When the number of pulses that have been transmitted from the output of the pseudo random pulse generator is equal to the random number present at the output R0, R1, R2, . . . , RN of the pseudo random modulus generator U16, the output of the modulus counter transits from the second logic level (1) to the first logic level (0).

The output of the modulus counter U17 is connected to the enable input of the pseudo random interval generator B U18. When the output of the modulus counter transits from the first logic level (0) to the second logic level (1), the pseudo random interval generator B U18 operates as described for FIG. 3. The inputs F1, F2, F3, . . . , F2$^M$ of the pseudo random interval generator B U18 are the digital waveforms as described in FIG. 3. The output Z2 of the pseudo random interval generator U18 forms the output of the pseudo random pulse generator.

The clock CLK synchronizes the generation of each of the pulses demarcating each interval during the active time.

If the sum of the intervals generated by the pseudo random interval generator U18 is longer than the time indicated as the active time Ta of FIG. 1 and generated by the random interval generator A U14, the number of pulses may be truncated and the active time Ta maintained or the total pulse selected by the random modulus generator U16 may be generated and the active time extended. Either alternative is in keeping with the intention of the invention.

The pseudo random pulse generator further may include the frequency divider U13. An external fundamental clock CLKIN is buffered and divided by successive powers of two to form the clock CLK, the digital waveforms F1, F2, F3, . . . F2$^M$, which are the inputs to the pseudo random interval generator B U18, and the digital waveforms F2$^M$+1, F2$^M$+2, F2$^M$+3, . . . , F2$^N$, which are the inputs to the pseudo random interval generator A U14. The clock CLK generally has a cycle time that is equal to that of the external fundamental clock CLKIN. Each successive digital waveform F1, F2, F3, . . . , F2$^M$, . . . F2$^N$ has a cycle time that is twice that of the previous digital waveform. That is, digital waveform F1 has a cycle time twice that of the external fundamental clock CLKIN. The digital waveform F2 has a cycle time that is four times that of the external fundamental clock CLKIN. The digital waveform F2$^M$ has a cycle time that 2$^M$ times that of the external fundamental clock CLKIN. And the digital waveform F2$^N$ has a cycle time that 2 N times that of the external fundamental clock CLKIN.

Figure 5:
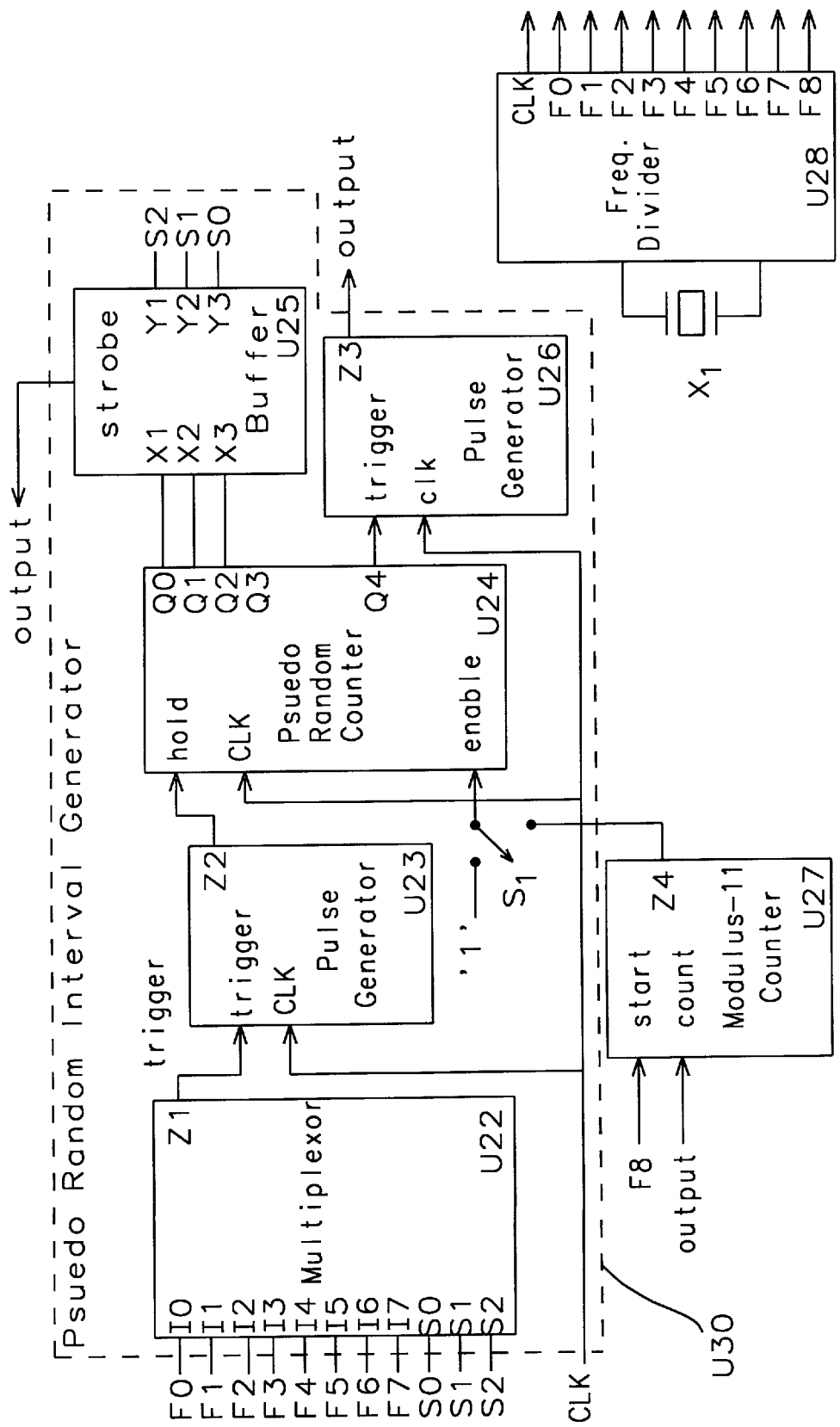
FIG. 5 is a block diagram of a second embodiment of a pseudo random pulse generator of this invention.

Refer now to FIG. 5 for a second embodiment of a pseudo random pulse generator of this invention. The pseudo random pulse generator U30 has the pseudo random counter U24. When the hold input $\overline{HOLD}$ is inactive and the enable input is active and at each active transition of the clock, the pseudo random counter U24 generates a pseudo random number at the outputs Q0, Q1, Q2, Q3, and Q4. The operation and structure of the pseudo random counter U24 is identical to the Nbit pseudo random counter U7 of FIG. 3.

The lower order digits of the random number present at outputs Q0, Q1, and Q2 of the pseudo random counter U24 are connected to the inputs X1, X2, X3 of the buffer circuit U25. When the output transits from the first logic level (0) to the second logic level (1) and returns to the first logic level after one cycle of the clock CLK, the digital signal present at the inputs X1, X2, and X3 is transferred to the outputs Y1, Y2, Y3 of the buffer U25. The outputs Y1, Y2, Y3 of the buffer U25 are connected to the select inputs S0, S1, S2 of the multiplexer U22.

The digital waveforms F0, F1, F2, F3, F4, F5, F6 and F7 are connected to the inputs I0 I1, I2, I3, I4, I5, I6 and I7 of the multiplexer U22. The low order digits Q0, Q1, and Q2 as transferred through the buffer U25 selects one of the digital waveforms F0, F1, F2, F3, F4, F5, F6 and F7 and transfer the selected digital waveform to the output Z1 of the multiplexer U22. The successive digital waveforms each have a cycle time that is twice that of the previous digital waveforms as described in FIG. 3.

The output Z1 of multiplexer U22 is the trigger input of the pulse generator U23. The output Z2 of the pulse generator U23 transits from the first logic level (0) to the second logic level (1) and after one clock cycles return to the first logic level (0), when the trigger signal transits from the first logic level (0) to the second logic level (1) and the critical edge of the clock CLK arrives.

The output Z2 of the pulse generator U23 connected to the hold input $\overline{HOLD}$ of the pseudo random counter U24. When the output Z2 of the pulse generator U23 has transited to the second logic level (1) for the one clock cycle, the pseudo random counter generates a new random number.

The enable input of the pseudo random counter U24 is connected to the switch S1. If the switch S1 is connected to the second logic level (1), the pseudo random interval generator U30 continuously generates the pulses at the output that have pseudo random intervals.

The high order output Q4 of the pseudo random counter U24 is connected to the trigger input of the pulse generator U26. When the trigger input transits from the first logic level (0) to the second logic level (1) and at the arrival of the critical edges of the clock CLK, the output Z3 of the pulse generator U26 transits from the first logic level (0) to the second logic level (1) for one cycle of the clock CLK and returns to the first logic level (0). The output Z3 of the pulse generator U26 forms the output of the pseudo random interval generator U30.

The enable input of the pseudo random counter U24 can be connected through the switch S1 to the output Z4 of the Modulus-11 counter U27. The start input of the Modulus-11 counter U27 initiates the active time Ta of FIG. 1 for this embodiment of the pseudo random pulse generator. The output of pseudo random pulse generator is connected to the count input of the Modulus-11 counter U27. The Modulus-11 counter U27 counts 11 output pulses and then disables the pseudo random interval generator U30 until the arrival of the next activation signal at the start input.

The digital waveforms F0, F1, F2, F3, F4, F5, F6 and F7 are generated by the frequency divider U28. A fundamental frequency is created by the crystal X1 and an oscillator incorporated in the frequency divider U28. The fundamental generator is buffered and divided to form the clock CLK and the digital waveforms F0, F1, F2, F3, F4, F5, F6 and F7. The digital waveforms F0, F1, F2, F3, F4, F5, F6 and F7 each have cycle times that are a factor of 2 longer than the previous cycle time. That is digital waveform F0 has a cycle time that is two times that of the clock CLK and the digital waveform F8 has a cycle time that is two times that of digital waveform F7 and 512 (2$^9$) times that of the clock CLK.

The digital waveform F8 is connected to the start input of the Modulus-11 counter U27. When the digital waveform F8 transits from the first logic level (0) to the second logic level (1), the output Z4 of the Modulus-11 counter U27 transits from the first logic level (0) to the second logic level (1) to initiate the generation of the 11 pseudo randomly spaced pulse at the output of the pseudo random pulse generator.

It is apparent to those skilled in the art that the Modulus-11 counter U27 may be of any modulus. It is preferable that the modulus be an odd number and even more preferable a prime number.

Figure 6:
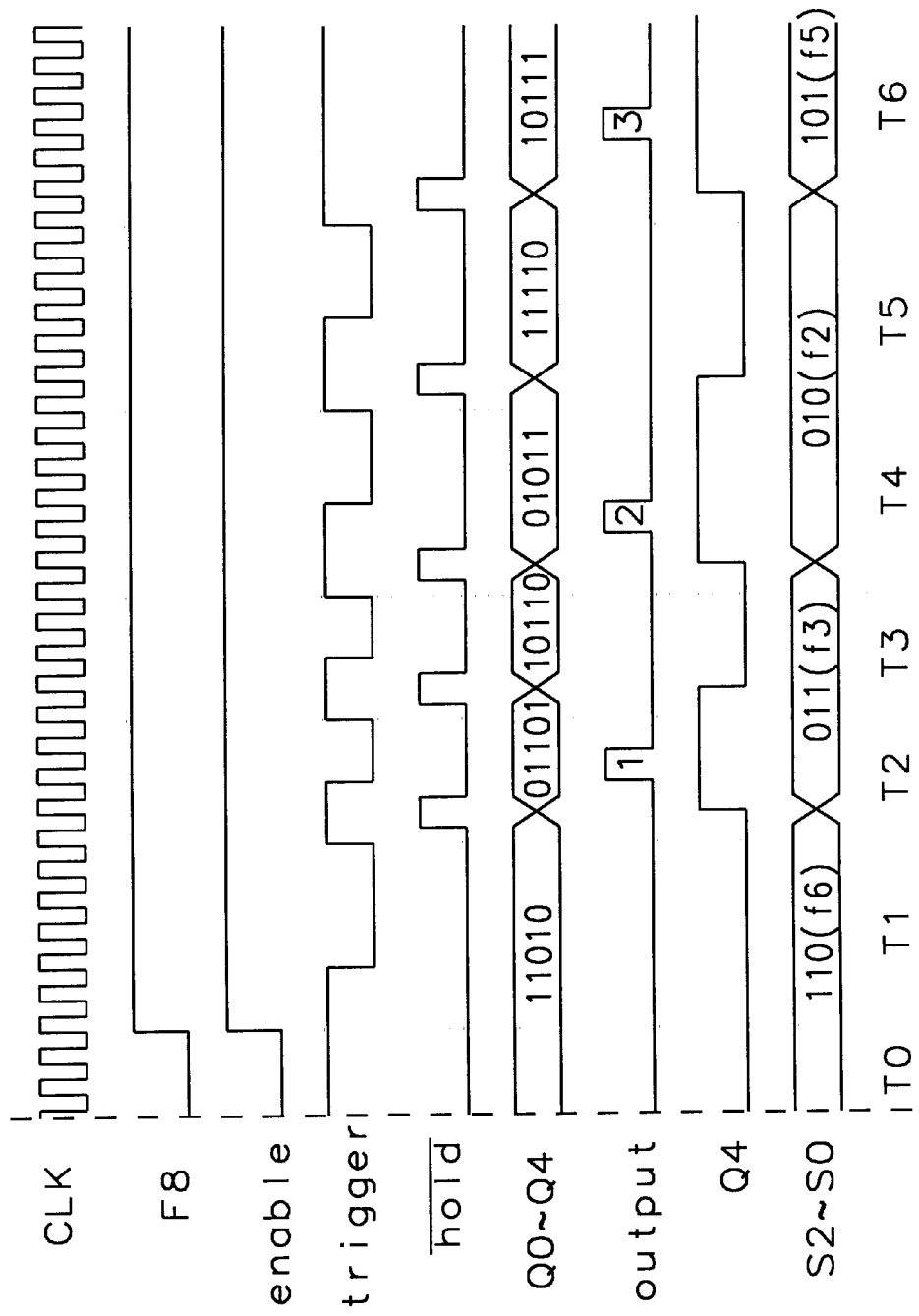
FIG. 6 is a timing diagram of the operation of the second embodiment of the pseudo random pulse generator of this invention.

Refer now to FIG. 6 for a timing diagram of the operation of the pseudo random pulse generator of FIG. 5. During time interval T0, the enable signal is at the first logic level (0) and the output does not generate any pulses. This is the inactive time Tia of FIG. 1. The pseudo random counter U24 has its outputs Q0, Q1, Q2, Q3, and Q4 set to the last value generated, in this case 11010. The output Q4 of the pseudo random counter U24 is at the first logic level (0) and is not changed preventing and generation of the output pulse.

The lower order output Q0, Q1 and Q2 is at the values 110(6) as are the outputs Y1, Y2 and Y3 of the buffer U25. This has selected the digital waveform F6 to be transferred to the output Z1 of the multiplexer U22.

At the beginning of the time interval T1 the digital waveform F8 transits from the first logic level (0) to the second logic level as does the enable signal. The pseudo random counter U24 is activated but in a hold state since the hold signal $\overline{HOLD}$ is at the first logic level. The trigger signal follows the digital waveform F6 and transit from the second logic level (1) to the first logic level (0).

As the trigger signal transits from the first logic level (0) to the second logic level (1), the hold signal $\overline{HOLD}$ is disabled for one clock cycle during the interval T2. The pseudo random counter U24 generates a new random number such as 01101. At this time, the high order digit Q4 of the pseudo random counter transits from the first logic level (0) to the second logic level (1), and the output has a pulse 1. This causes the low order bits Q0, Q1, and Q2 to be transferred to the select inputs S0, S1, and S2 of the multiplexer U22. The select inputs S0, S1, and S2 are set to a 011 (3) to select the digital waveform F3.

As the digital waveform F3 transits from the first logic level (0) to the second logic level (1), the trigger signal transits from the first logic level (0) to the second logic level (1) and disable the hold signal $\overline{HOLD}$ for one clock cycle. This is during the interval T3. While hold signal $\overline{HOLD}$ is disabled, a new pseudo random number is generated by the pseudo random counter U24. The new pseudo random number is 10110 in this case.

Since the high order digit Q4 of the pseudo random number is now 0, there is no output pulse and the digital waveform F3 remains selected.

At the beginning of the time T4, the second transition of the digital waveform F3 and thus the trigger signal from the first logic level (0) to the second logic level (1) occurs. The hold signal $\overline{HOLD}$ again is disabled for one clock cycle and the pseudo random number generator U24 creates a new pseudo random number. In this case, the number is 01011.

The high order digit Q4 is now 1 and the output pulse 2 is transmitted. The buffer U25 has its strobe activated and the low order digits Q0, Q1, and Q2 is transferred to the select lines S0, S1 and S2 of the multiplexer U22. The lower digits Q0, Q1, and Q2 have the value 010 to choose the digital waveform F2.

The transition of the frequency F2 and thus the trigger from the first logic level (0) to the second logic level (1) is the beginning of time T5. The hold signal $\overline{HOLD}$ is disabled for one clock cycle and a new pseudo random number is generated, in this case 11110.

Since the high order digit Q4 is now 0, no new output pulse is generated. The low order bits Q0, Q1, and Q2 of the pseudo random number are not transferred to become the select signals S0, S1 and S2 of the multiplexer U22. The digital waveform F8 remains selected.

The time T6 begins with the transition of the digital waveform F2 and thus the trigger signal from the first logic level (0) to the second logic level (1). The hold signal $\overline{HOLD}$ is disabled for one clock cycle and new pseudo random number is generated. The new pseudo random number is now 10111. Since the high order digit Q4 is now 1, the output has the pulse 3. The output pulse strobes the buffer and the low order digits Q0, Q1, and Q2 is transferred to become the select signals S0, S1, and S2. The lower digits are 101(5) selects the digital waveform F5 to determine the next interval.

The above-described sequence is repeated until the Modulus-11 counter has received the 11 output pulses and then the enable signal transits from the second logic level (1) to the first logic level (0) and the pseudo random interval generator U30 is disabled.

Figure 7:
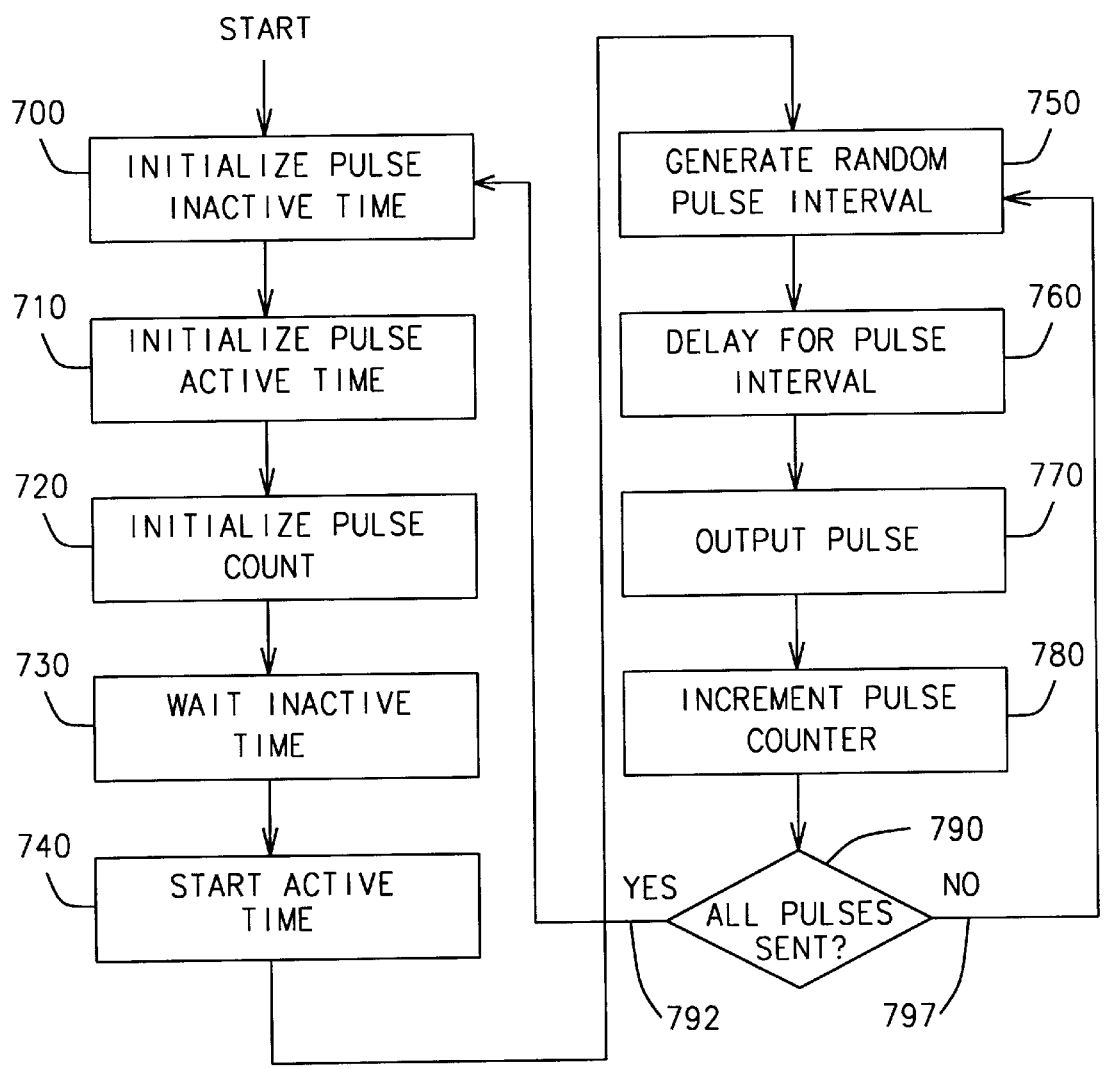
FIG. 7 is a flow chart of a general method to create a pseudo random interval.

Refer now to FIG. 7 for a discussion of a method to generate pulses having pseudo random characteristics as described in FIG. 1. The inactive time Tia, the active time Ta, and the number of pulses $P_1, P_2, \ldots, P_n$ is initialized 700, 710, and 720. The inactive time Tia, the active time Ta, and the number of pulses $P_1, P_2, \ldots, P_n$ can either be fixed or randomly generated.

The method is placed in a wait state 730 for the inactive time Tia. Then the active time Ta is started. The first random interval is generated 750. The method then delays 760 activity for the pulse interval. And output pulse is generated 770 and the pulse counter is incremented 780.

The pulse counter is compared 790 with the initialize pulse count. If the pulse counter indicates that all the pulses have not been transmitted 797, the method returns to generate 750 a random pulse interval. If all the pulses have been transmitted 792, the inactive time Tia, the active time Ta, and the number of pulses $P_1, P_2, P_3, \ldots, P_n$ is reinitialized 700, 710, and 720. The method is continuously repeated.

It is apparent to those skilled in the art that a microprocessor or microcontroller could be programmed to accomplish the above method. The structures of the microprocessors have register sets that can be connected as linear feedback shift register to execute commands such as SHIFT and ROTATE. Logical manipulation of bits to perform an exclusive-OR function is well understood. Therefore, an additive congruential pseudo random number generation using a linear feedback shift register with the input being the exclusive-OR of other bits within the shift register would be relatively easy.

More complicated methods of random number generation such as the linear congruential pseudo random number generation can be implemented using more advanced algorithms. Further, microcontrollers having hardware incorporated to perform counter/timer functions are able to perform other tasks while performing the above method.

While this invention has been particularly shown and described with reference to the preferred embodiments thereof, it is understood by those skilled in the art that various changes in form and details may be made without departing from the spirit and scope of the invention.

The invention claimed is:

1. A pseudo random pulse generator to create a series of pulses, whereby each time interval between each pulse of said series of pulses has a random duration, comprising:

a pseudo random number generator to create a series of pseudo random binary numbers, having an enable input to initiate creating said series of pseudo random binary numbers, a clock input connected to a clock signal to synchronize creating said series of pseudo random binary numbers, a plurality of output terminals to hold each pseudo random binary number for transfer, and a hold input to prevent the generation of one pseudo random binary number during a clock cycle;

an interval selector having a plurality of timing signal input terminals to receive a plurality of timing signals, whereby each timing signal is a power of two frequency division of the clock, a plurality of select signal terminals to select one of the plurality of timing signals, and a trigger output to hold a selected timing signal;

a select buffer having a plurality of input terminals connected to a low order subset of the plurality of output terminals of the pseudo random number generator, a plurality of output terminal connected to the select signal terminals of the interval selector, and a strobe input to transfer a low order pseudo random number from the plurality of input terminals to the plurality of output terminals, whereby the low order pseudo random number present at the low order subset of the plurality of output terminals selects one of the plurality of timing signals;

a first pulse generator having a trigger input connected to the trigger input of the interval selector, a clock input connected to the clock signal, and a hold output, whereby the hold output transits from a first logic level to a second logic level and return to the first logic level after one clock cycle when the selected timing signal transit between the first logic level and the second logic level;

a second pulse generator having a trigger input connected to a higher order output terminal of the plurality of output terminals of the pseudo random number generator, a clock input connected to the clock signal, and pulse output to transfer the series of pulses to external circuitry, whereby the pulse output transits from the first logic level to the second logic level and return to the first logic level after one clock cycle when the higher order output terminal transits between transits between the first logic level and the second logic level.

2. The pseudo random pulse generator of claim 1 further comprising a frequency synthesizer whereby said frequency synthesizer comprises:

a frequency generating source to create a fundamental frequency signal;

a frequency dividing circuit to create the plurality of timing signals by dividing the fundamental frequency signal by successive powers of two;

a clock output terminal to transfer the fundamental frequency signal as the clock; and a plurality of timing signal output terminals connected to the timing signal input terminals of the interval selector to transfer the plurality of timing signals to the interval selector.

3. The pseudo random pulse generator of claim 2 wherein the frequency dividing circuit further creates a high order timing signal having a frequency that is one half a highest order timing signal of the plurality timing signals, and wherein said frequency synthesizer further comprises a higher order output terminal connected to the enable input of the pseudo random number generator to transfer the higher order timing signal to initiate creating of the series of pseudo random binary numbers when the higher order timing signal transits between the first logic level and the second logic level.

4. The pseudo random pulse generator of claim 1 wherein the pseudo random number generator is an additive congruential pseudo random number generator.

5. The pseudo random pulse generator of claim 1 wherein the pseudo random number generator is a linear feedback shift register having a plurality of flip-flops connected serially to form a shift register with a last flip-flop output logically combined with any other flip-flop output to form an input of a first flip-flop of the plurality of flip-flops.

6. The pseudo random pulse generator of claim 5 wherein the plurality of flip-flops is at least a number of digits of the pseudo random binary number in addition to a digit representing the higher order output terminal of the pseudo random number generator.

7. A two dimensional pseudo random pulse generator to create a series of pseudo randomly separated pulses during an active time period having pseudo random length, comprising:

a first pseudo random interval generation means to create the active time;

a toggle circuit having an input connected to a pulse output terminal of the first random interval generation means and an interval trigger output that changes alternately between a first logic level and a second logic level at an arrival of pulses from the first random interval generation means, whereby a first pseudo random time period between a first pulse and a second pulse determines the active time period and a second pseudo random time period between the second pulse determines an inactive time period;

a random modulus generator having an initiate input terminal connected to the interval trigger output to initiate generation of pseudo random number indicating the number of pulses in the series of pseudo randomly separated pulses, a clock input to synchronize the generation of the pseudo random number, and a plurality of outputs containing the pseudo random number;

a modulus counter having a start input connected to the interval trigger output of the toggle circuit to initialize the counter to a beginning count, a plurality of count inputs connected to the plurality of outputs of the random modulus generator to receive the pseudo random number, a clock input to receive the clock to synchronize the modulus counter, a count input to receive and count the series of pseudo randomly separated pulses, and a count-in-progress terminal which maintains the first logic level during the counting of the series of pseudo randomly separated pulses and assume the second logic level when the counting of the series of pseudo randomly separated pulses is equal to the pseudo random number; and a second pseudo random interval generation means, to create pseudo random intervals between each pulse of the series of pseudo randomly separated pulses, having an enable input connected to the count-in-progress terminal, a clock input to synchronize the generation of the pseudo random intervals between the pulses of the series of pseudo randomly separated pulses, a pseudo output to transmit the series of pseudo randomly separated pulses.

8. The two dimensional pseudo random pulse generator of claim 7 wherein the first and second pseudo random interval generation means comprises:

a pseudo random number generator to create a series of pseudo random binary numbers, having an enable input to initiate creating said series of pseudo random binary numbers, a clock input connected to the clock signal to synchronize creating said series of pseudo random binary numbers, a plurality of output terminals to hold each pseudo random binary number for transfer, and a hold input to prevent the generation of one pseudo random binary number during a clock cycle;

an interval selector having a plurality of timing signal input terminals to receive a plurality of timing signals, whereby each timing signal is a power of two frequency division of the clock, a plurality of select signal terminals to select one of the plurality of timing signals, and a trigger output to hold a selected timing signal;

a select buffer having a plurality of input terminals connected to a low order subset of the plurality of output terminals of the pseudo random number generator, a plurality of output terminal connected to the select signal terminals of the interval selector, and a strobe input to transfer a low order pseudo random number from the plurality of input terminals to the plurality of output terminals, whereby the low order pseudo random number present at the low order subset of the plurality of output terminals selects one of the plurality of timing signals;

a first pulse generator having a trigger input connected to the trigger input of the interval selector, a clock input connected to the clock signal, and a hold output, whereby the hold output transits from a first logic level to a second logic level and return to the first logic level after one clock cycle when the selected timing signal transit between the first logic level and the second logic level;

a second pulse generator having a trigger input connected to a higher order output terminal of the plurality of output terminals of pseudo random number generator, a clock input connected to the clock signal, and pulse output to transfer the series of pulses to external circuitry, whereby the pulse output transits from the first logic level to the second logic level and return to the first logic level after one clock cycle when the higher order output terminal transits between transits between the first logic level and the second logic level.

9. The two dimensional pseudo random pulse generator of claim 7 further comprising a synthesizer, whereby said frequency synthesizer comprises:

a frequency generating source to create a fundamental frequency generator signal;

a frequency dividing circuit to create the plurality of timing signals by dividing the fundamental frequency signal by successive powers of two;

a clock output terminal to transfer the fundamental frequency as the clock;

a high order plurality of timing signal output terminals connected to the timing signal input terminals of the interval selector of the first pseudo random interval generator and;

a low order plurality of timing signal outputs connected to the timing signal input terminals of the interval selector of the second pseudo random interval generator.

10. The two-dimensional pseudo random pulse generator of claim 8 wherein the pseudo random number generator is an additive congruential pseudo random number generator.

11. The two dimensional pseudo random pulse generator of claim 8 wherein the pseudo random number generator is a linear feedback shift register having a plurality of flip-flops connected serially to form a shift register with a last flip-flop output logically combined with any other flip-flop output to form an input of a first flip-flop of the plurality of flip-flops.

12. The two dimensional pseudo random pulse generator of claim 11 wherein the plurality of flip-flops must number at least a number of digits of the pseudo random binary number in addition to a digit representing the higher order output terminal of the pseudo random number generator.

13. A pseudo random pulse generator to create a series of pseudo randomly separated pulse during a fixed length active time period, comprising:

a pseudo random number generator to create a series of pseudo random binary number, having an enable input to initiate creating said series of pseudo random binary numbers, a clock input connected to a clock signal to synchronize creating said series of pseudo random binary numbers, a plurality of output terminals to hold each pseudo random binary number for transfer, and a hold input to prevent the generation of one pseudo random binary number during a clock cycle;

an interval selector having a plurality of timing signal input terminals to receive a plurality of timing signals, whereby each timing signal is a power of two frequency division of the clock, a plurality of select signal terminals to select one of the plurality of timing signals, and a trigger output to hold a selected timing signal;

a select buffer having a plurality of input terminals connected to a low order subset of the plurality of output terminals of the pseudo random number generator, a plurality of output terminal connected to the select signal terminals of the interval selector, and a strobe input to transfer a low order pseudo random number from the plurality of input terminals to the plurality of output terminals, whereby the low order pseudo random number present at the low order subset of the plurality of output terminals selects one of the plurality of timing signals;

a first pulse generator having a trigger input connected to the trigger input of the interval selector, a clock input connected to the clock signal, and a hold output, whereby the hold output transits from a first logic level to a second logic level and return to the first logic level after one clock cycle when the selected timing signal transit between the first logic level and the second logic level;

a second pulse generator having a trigger input connected to a higher order output terminal of the plurality of output terminals of pseudo random number generator, a clock input connected to the clock signal, and pulse output to transfer a series of pseudo randomly separated pulses to external circuitry, whereby the pulse output transits from the first logic level to the second logic level and return to the first logic level after one clock cycle when the higher order output terminal transits between transits between the first logic level and the second logic level;

a modulus counter having a count input connected to the pulse output, a start count input to initiate the fixed length active time period, and count output connected to the enable input, whereby the count output assumes a logic level that enables the pseudo random number generator when the start count input is active and assumes a logic level that disables the pseudo random number generator when the modulus counter has counted a number of pulses that is contained in the series of pseudo randomly separated pulses.

14. The pseudo random pulse generator of claim 13 further comprising a frequency synthesizer, whereby said frequency synthesizer comprises:

a frequency generating source to create a fundamental frequency generator signal;

a frequency dividing circuit to create the plurality of timing signals by dividing the fundamental frequency signal by successive powers of two;

a clock output terminal to transfer the fundamental frequency as the clock; and a plurality of timing signal output terminals connected to the timing signal input terminals of the interval selector to transfer the plurality of timing signals to the interval selector.

15. The pseudo random pulse generator of claim 14 wherein the frequency dividing circuit further creates a high order timing signal having a frequency that is one half a highest order timing signal of the plurality timing signals, and wherein said frequency synthesizer further comprises a higher order output terminal connected to the enable input of the pseudo random number generator to transfer the higher order timing signal to initiate creating of the series of pseudo random binary numbers when the higher order timing signal transits between the first logic level and the second logic level.

16. The pseudo random pulse generator of claim 14 wherein the pseudo random number generator is an additive congruential pseudo random number generator.

17. The pseudo random pulse generator of claim 14 wherein the pseudo random number generator is a linear feedback shift register having a plurality of flip-flops connected serially to form a shift register with a last flip-flop output logically combined with any other flip-flop output to form an input of a first flip-flop of the plurality of flip-flops.

18. The pseudo random pulse generator of claim 17 wherein the plurality of flip-flops must number at least a number of digits of the pseudo random binary number in addition to a digit representing the higher order output terminal of the pseudo random number generator.

19. A method to generate a series of randomly separated pulses at an output of an electronic circuit comprising the steps of:

initializing an inactive time when said output is at a first logic level and does not change from said first logic level;

initializing an active time when said output has said series of randomly separated pulses;

initializing a pulse count declaring a number of pulses to be contained in the series of randomly separated pulses;

initializing the output to the first logic level and waiting the inactive time;

starting the active time;

generating a pseudo random interval delay time;

waiting the pseudo random interval delay time;

transiting said output from the first logic level to the second logic level for a clock time and returning the output to the first logic level to transmit one pulse of the series of randomly separated pulses;

incrementing an output pulse counter indicating a number of transmitted pulses;

comparing the number of transmitted pulses to the number of pulses to be contained in the series of the randomly separated pulses;

if the number of transmitted pulses is less than the number of pulses to be contained in the series of randomly separated pulses, returning to the step of generating the pseudo random interval delay time if the number of transmitted pulses is equal to the number of pulses to be contained in the series of the randomly separated pulses, returning to initializing the inactive time.

20. The method of claim 19 wherein the inactive time is a first pseudo randomly generated value.

21. The method of claim 19 wherein the active time is a second randomly generated value.

22. The method of claim 19 wherein the pseudo random interval delay time is generated by a first additive congruential random number generator.

23. The method of claim 20 wherein the first pseudo randomly generated value is generated by a second additive congruential random number generator.

24. The method of claim 21 wherein the second pseudo randomly generated value is generated by a third additive congruential random number generator.

25. The method of claim 19 wherein the pseudo random interval delay time is generated by a first linear feedback shift register having an input determined as a more significant digit of a previous pseudo random interval delay time exclusive-OR'ed with at least one other digit of the previous pseudo random interval.

26. The method of claim 20 wherein the first pseudo randomly generated value is generated by a second linear feedback shift register having an input determined as a more significant digit of a previous first pseudo randomly generated value exclusive-OR'ed with at least one other digit of the previous first pseudo randomly generated value.

27. The method of claim 21 wherein the inactive time is a second pseudo randomly generated value.

* * * * *